United States Patent [19]

Geissler et al.

[11] Patent Number: 5,182,187

[45] Date of Patent: Jan. 26, 1993

[54] RADIATION-POLYMERIZABLE COMPOSITION AND RECORDING MATERIAL PREPARED FROM THIS COMPOSITION

[75] Inventors: Ulrich Geissler, Hochheim; Hartmut Wiezer, Eppstein-Vockenhausen, both of Fed. Rep. of Germany

[73] Assignee: Hoechst Aktiengesellschaft, Frankfurt am Main, Fed. Rep. of Germany

[21] Appl. No.: 617,378

[22] Filed: Nov. 26, 1990

Related U.S. Application Data

[63] Continuation of Ser. No. 310,239, Feb. 14, 1989, abandoned.

[30] Foreign Application Priority Data

Feb. 24, 1988 [DE] Fed. Rep. of Germany ....... 3805706

[51] Int. Cl.$^5$ .................... G03C 1/795; G03C 1/77; G03F 7/033
[52] U.S. Cl. ................... 430/271; 430/275; 430/277; 430/278; 430/279; 430/281; 430/284; 430/288; 430/910; 430/915
[58] Field of Search ............... 430/915, 281, 288, 275, 430/277, 278, 279, 910, 284

[56] References Cited

U.S. PATENT DOCUMENTS

| | | | |
|---|---|---|---|
| 3,796,578 | 3/1974 | Hosoi et al. | 96/67 |
| 3,804,631 | 4/1974 | Faust | 430/910 |
| 3,930,865 | 1/1976 | Faust et al. | 96/86 |
| 3,953,408 | 4/1976 | Hosoi et al. | 260/836 |
| 4,239,849 | 12/1980 | Lipson et al. | 430/281 |
| 4,273,857 | 6/1981 | Leberzammer et al. | 430/281 |
| 4,629,680 | 12/1986 | Iwasaki et al. | 430/288 |
| 4,692,396 | 9/1987 | Uchida | 430/284 |
| 4,705,740 | 11/1987 | Geissler et al. | 430/288 |
| 4,806,450 | 2/1989 | Hofmann et al. | 430/281 |
| 4,849,322 | 7/1989 | Bauer et al. | 430/285 |
| 4,925,768 | 5/1990 | Iwasaki et al. | 430/905 |
| 4,925,771 | 5/1990 | Nabe et al. | 430/281 |

FOREIGN PATENT DOCUMENTS

| | | |
|---|---|---|
| 1056189 | 6/1979 | Canada . |
| 3741926 | 6/1988 | Fed. Rep. of Germany . |
| 2059982 | 4/1981 | United Kingdom . |

*Primary Examiner*—Marion E. McCamish
*Assistant Examiner*—Christopher RoDee
*Attorney, Agent, or Firm*—Foley & Lardner

[57] ABSTRACT

Radiation-polymerizable composition which comprises
a) a constituent that can be polymerized by free radicals and has a boiling point above 100° C.,
b) a photoinitiator, and
c) a copolymer comprising units of
  c1) an $\alpha$, $\beta$-unsaturated aliphatic carboxylic acid,
  c2) an alkyl, cycloalkyl or cycloalkenyl methacrylate, and
  c3) an alkyl, cycloalkyl or cycloalkenyl acrylate and has an acid number of 78 to 176 and a glass transition temperature of 290 to 340 K. The composition is characterized by its ready developability at a low acid number and its good resistance to alkaline etching solutions.

16 Claims, No Drawings

RADIATION-POLYMERIZABLE COMPOSITION AND RECORDING MATERIAL PREPARED FROM THIS COMPOSITION

This application is a continuation of application Ser. No. 07/310,239, filed Feb. 14, 1989, now abandoned.

BACKGROUND OF THE INVENTION

The invention relates to a composition which is polymerizable by actinic radiation, in particular by light, and comprises
   a) a constituent which can undergo free-radical polymerization, contains at least one terminal ethylenically unsaturated group and has a boiling point above 100° C. under normal pressure,
   b) a compound which is capable of initiating the polymerization of constituent (a), under the action of actinic radiation, and
   c) a saturated copolymer as a binder, which is insoluble in water and soluble in aqueous-alkaline solutions.

Photopolymerizable compositions of the indicated type are known and are used, inter alia, in the preparation of photopolymerizable printing plates and photoresist materials. An important field of application for such compositions is the preparation of dry photoresist materials.

DE-A 20 64 080 describes compositions of this type that contain, as binders, copolymers of methacrylic acid and alkyl methacrylates having at least four carbon atoms in the alkyl group, preferably terpolymers of methacrylic acid, methyl or ethyl methacrylate and an alkyl methacrylate having 4 to 15 carbon atoms in the alkyl group.

It is stated that an acid number in the range from 150 to 250 is necessary, in order to achieve developability in aqueous-alkaline media. In the case of layer thicknesses of at least 20 μm, polymers having acid numbers above 200 are invariable employed. The developers used are generally particularly active and comprise, for example, aqueous solutions of sodium metasilicate and organic additions.

DE-A 23 63 806 describes similar compositions which, with a view to reducing cold flow in the unexposed state, contain terpolymers of methacrylic acid, an alkyl methacrylate and a further monomer, the homopolymer of which has a glass transition temperature of at least 80° C. As monomers of this type, styrene, substituted styrenes and acrylonitrile are, in particular, mentioned. Also in this case, acid numbers of 170 to 250 are recommended.

Similar compositions based on the aboveindicated copolymers having an average molecular weight in the range from about 50,000 to 200,000 and acid numbers which are preferably in the range from 170 to 250 are described in DE-A 34 27 519.

In all binders having high acid numbers the desired easy developability is accompanied by reduced resistance of the light-hardened areas to alkaline solutions, for example, to the developer or to alkaline etching solutions.

DE-B 25 17 656 describes other compositions similar to those described above, which are intended for use in the preparation of dry resist materials and require, as a binder, a combination of two acidic polymers. Under certain conditions, one of these polymers is soluble in dilute aqueous sodium hydroxide solution and the other is insoluble. It is naturally technically more expensive to prepare a composition which must contain two binders of different solubilities and the composition is more prone to disintegration upon standing in solution or during the drying process than is a composition containing a uniform binder. There may also be a risk of constituents of the more difficultly soluble polymer separating from the solution in the developer and restricting the further use of the developer.

DE-A 30 28 136 describes similar photopolymerizable compositions which are suitable for the preparation of dry resists. The polymerizable compounds contained in these compositions comprise, inter alia, polyethylene glycol di(meth)acrylates. The binders used comprise copolymers of (meth)acrylic acid and alkyl(meth)acrylates, in particular terpolymers of methacrylic acid, methyl methacrylate and an alkyl(meth)acrylate having a relatively long alkyl group. The polymers used in the compositions have relatively high glass transition temperatures and thus impart a relatively high brittleness to the photocrosslinked composition. Brittleness is compensated for by a comparatively high monomer content, in particular by the above-mentioned strongly plasticizing monomers, but the high monomer content leads to a deterioration of other properties, such as resistance to aqueous, e.g. alkaline treating solutions, or cold flow.

DE-A 21 64 518 describes photopolymerizable compositions containing polymers with lateral (meth)acrylic ester groups. The compositions there described are processed into planographic printing plates having layer thicknesses of not more than 3 μm. The saturated base polymers used for the preparation of the unsaturated polymers contain units of unsaturated carboxylic acids, (meth)acrylic esters, (meth)acrylonitrile, vinyl aromatic compounds and the like.

The suitability of photopolymerizable compositions for use in dry photoresist materials depends on the proper mutual coordination of various properties, for example, softness of the layer, adhesion to films, adhesion to copper, flexibility, developability, resistance to etching solutions and electroplating baths, applicability to the covering of drilled holes (tenting) and strippability. The known photopolymerizable compositions which can be processed in aqueous-alkaline solutions have one or more of the following disadvantages:
   excessive tackiness of the resist layer,
   poor adhesion of the photopolymer layer to the polyester support film,
   insufficient adhesion to copper,
   brittleness in the exposed state,
   long development times,
   inadequate resistance in etching and electroplating processes,
   unsatisfactory toughness for tenting,
   poor stripping behavior.

SUMMARY OF THE INVENTION

Accordingly, it is an object of the present invention to provide a radiation-polymerizable composition which is suitable for use in the preparation of dry photoresist materials and in which easy developability in purely aqueous-alkaline solutions is combined with good resistance to alkaline etching media. In its preferred embodiments, the composition should not exhibit any of the above-indicated disadvantages. In accomplishing the foregoing objectives, there has been provided, in accordance with one aspect of the present invention, a radiation-polymerizable composition comprising
  a) a constituent which can undergo free-radical polymerization, contains at least one terminal ethylenically unsaturated group and has a boiling point above 100° C. under normal pressure,
  b) a compound which is capable of initiating the polymerization of constituent (a) under the action of actinic radiation, and
  c) a saturated copolymer which is insoluble in water and soluble in organic solvents and in aqueous-alkaline solutions, and which comprises units of
    c1) an $\alpha,\beta$-unsaturated aliphatic carboxylic acid,
    c2) an alkyl, cycloalkyl or cycloalkenyl methacrylate, and
    c3) an alkyl, cycloalkyl or cycloalkenyl acrylate,
and has an acid number of about 78 to 176 and a glass transition temperature of about 290 to 340K. Preferably said copolymer is soluble in a 1% strength sodium carbonate solution. In a preferred embodiment, the copolymer further comprises a compound c4 which is copolymerizable with c1-c3 and contains an aromatic substituent.

In accordance with another aspect of the present invention there is provided a radiation-sensitive recording material which comprises a support and a radiation-sensitive layer comprising the above-described composition.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The unsaturated aliphatic carboxylic acid c1 contained in the copolymer preferably comprises acrylic acid, methacrylic acid, crotonic acid, sorbic acid, maleic acid, itaconic acid or half esters of the dicarboxylic acids mentioned.

Particularly favorable is methacrylic acid or a mixture of acrylic and methacrylic acids containing up to about 50% of acrylic acid.

The alkyl methacrylates c2, in general, contain 1 to 6, preferably 1 to 4, carbon atoms in the alkyl group. Methyl methacrylate is particularly preferred. The preferred cycloaliphatic groups are those having 5 to 10 ring members and up to 11 carbon atoms. Examples are cyclopentyl-, methylcyclopentyl-, cyclohexyl-, trimethylcyclohexyl-, 3-cyclohexylpropyl-, dimethylcyclohexenyl-, methoxycycloheptyl-, isobornyl-, tricyclo[5.2.1.0.$^{2,6}$]dec-8-yl-, tricyclo[5.2.1.0.$^{2,6}$]dec-3-en-8-yl-, tricyclo[5.2.1.0.$^{2,6}$]dec-8-yl-methyl-, tetrahydrofurfuryland furfuryl groups. Of these, cyclopentyl-, cyclo- hexyl- and tricyclo[5.2.1.0.2,6]dec-3-en-8- or -9-ylgroups are preferred.

The alkyl acrylates c3 contain at least 2, preferably 2 to 10 and, in particular, 4 to 8 carbon atoms in the alkyl group. Butyl acrylate and ethyl hexyl acrylate are particularly preferred. Suitable cycloaliphatic groups are those specified under c2 above.

The component c4 used comprises, in particular, mononuclear vinyl aromatic compounds such as styrene, substituted styrenes, for example, vinyl toluene, vinyl xylene, $\alpha$-methylstyrene, p-chlorostyrene, o-methoxystyrene, m-bromostyrene or p-ethylstyrene, and (meth)acrylic esters of aromatic alcohols, for example, benzyl alcohol, phenyl ethanol, phenyl propanol, phenoxy ethanol or p-bromobenzyl alcohol. (Meth)acrylic esters of phenols, for example, phenyl(meth)acrylate or pyrocatecholmono(meth)acrylate can also be used. Preference is given to styrene and substituted styrenes, in particular, to unsubstituted styrene.

The amount of component c1 is, in general, about 12 to 27 % by weight, preferably 17 to 25 % by weight, the amount of component c2 is about 5 to 60 % by weight, preferably 20 to 50 % by weight, the amount of component c3 is about 15 to 50 % by weight, preferably 20 to 45 % by weight, and the amount of component c4 is about 0 to 30 % by weight, preferably 1 to 20 % by weight, particularly preferably 5 to 10 % by weight. Resist layers with styrenecontaining binders show a particularly high resistance to etching media containing ammonia.

In accordance with the specified amounts of c1, the acid numbers of the polymers are in the range from about 78 to 176, preferably from 98 to 176 and, in particular from 111 to 163.

In order for the copolymers to meet the processing requirements of the dry resist method, it is necessary that they possess a glass transition temperature Tg within a certain range. The Tg values of copolymers can be calculated approximately from the Tg values of the homopolymers of the individual components, according to the following formula:

$$\frac{100}{T_{gMP}} = \frac{m_A}{T_{gA}} + \frac{m_B}{T_{gB}} + \frac{m_C}{T_{gC}} + \cdots$$

In this formula,
  $T_{gMP}$ denotes the glass transition temperature of the copolymer (in Kelvin),
  $T_{gA\ (B,\ C.)}$ denotes the glass transition temperature of the homopolymer of A (B, C, etc.) (in Kelvin) and
  $m_{A\ (B,\ C.)}$ denotes the amount of A (B, C, etc.) in the copolymer, in % by weight.

The calculated Tg values of the copolymers range between about 290 and 340K., preferably between and 330K., in particular between 305 and 330K.

In the process, the Tg values must be adjusted by carefully selecting the nature and amounts of the individual monomers. This is particularly critical in the case of the terpolymers which do not contain a component c4. Here, the type and quantity of the "soft" component c3 must be exactly adjusted to the type and quantity of the "hard" component c2. If, for example, methyl methacrylate is used as the preferred component c2, the product obtained by multiplying the difference of the glass transition temperatures of c2 and c3 by the amount of c3 in percent should be at least 4000:

$$(T_{gc2} - T_{gc3}) \times m_{c3} \geq 4000$$

By maintaining this relationship it is ensured that in the case of a component c3, the homopolymer of which has a higher glass transition temperature, for example ethyl acrylate, a correspondingly higher amount is used in order to keep the terpolymer from becoming too brittle.

The amount of cl also has a considerable influence on this relationship, since the preferred component, namely methacrylic acid, adds a relatively high glass transition temperature. Basically, the above-indicated product should therefore be greater, as the acid number of the terpolymer increases. Within the limits specified, the amount of cl can be adjusted to the required properties of the final composition. If it is desirable to have a material which is particularly readily developable by means of weakly alkaline developers the acid number should rather be in the upper portion of the range and it should rather be in the lower portion, if a higher etch resistance to alkaline media is required.

The glass transition temperatures of the homopolymers corresponding to the individual monomers were taken from "Polymer Handbook" by J. Brandrup and E. H. Immergut, Part III, page 144 et seq. In detail, the calculations given in the examples were based on the following values:

|  | $T_g$ (K) |
| --- | --- |
| polymethacrylic acid | 501 |
| polyacrylic acid | 379 |
| polymethyl methacrylate (atactic) | 378 |
| polybutyl methacrylate (atactic) | 293 |
| polyhexyl methacrylate | 268 |
| polyethyl acrylate (conventional) | 249 |
| polybutyl acrylate | 219 |
| polyethylhexyl acrylate | 223 |
| polyoctyl acrylate | 208 |
| polydecyl acrylate | 230* |

*taken from "Thermoplastische Methacrylat-Festharze" ["Thermoplastic Methacrylate Resins"] by G. Kuehl and H. D. Christian in "Farbe + Lack" ["Paint + Varnish"] 12/1986, page 1142 et seq.

The mean molecular weights ($M_w$) of the copolymers are preferably in the range from 50,000 to 200,000, as determined by gel permeation chromatography. The copolymers can be prepared by conventional industrial polymerization processes, for example, in solvents or precipitating agents, or by mass polymerization in the presence of a polymerization initiator that forms free radicals.

The preparation is carried out in a conventional manner in flat containers, in order to permit better temperature monitoring. Peroxides or azo compounds, which form free radicals when heated, are used as initiators, in a known manner. In order to obtain a uniform molecular weight distribution, it is advantageous to add a small amount of a chain regulator, such as a mercapto compound. It is also possible to add a small amount (e.g., less than 10% by weight of the monomer mixture) of a solvent, such as water or a lower alcohol. The temperature can be between about 30° and 130° C.

The compositions according to the present invention contain polymerizable compounds which preferably have at least two terminal ethylenic double bonds. The polymerizable compounds generally used are esters of acrylic or methacrylic acid with polyhydric, preferably primary, alcohols. Examples of suitable polyhydric alcohols are ethylene glycol, propylene glycol, butane-1,4-diol, butane-1,3-diol, diethylene glycol, triethylene glycol, and polypropylene glycols having molecular weights of about 200 to 1,000, neopentylglycol, glycerol, trimethylolethane and trimethylol propane, pentaerythritol, bisphenol A derivatives, and reaction products of these compounds with ethylene oxide and/or propylene oxides. Bisacrylates and bismethacrylates which contain urethane groups, and which are obtained by reacting 1 mole of a diisocyanate with 2 moles of a hydroxyalkyl acrylate or methacrylate, are particularly suitable. The diisocyanate used can also comprise an oligomeric product which is obtained by reacting a diol with a molar excess of a monomeric diisocyanate. Monomers of this type and similar monomers, which contain urethane groups are described in DE-A 20 64 079, 28 22 190, 30 48 502 and 35 40 480. Based on its total content of monomers, the composition should preferably contain at least 40%, in particular at least 60%, of monomers having at least one urethane group in their molecule.

A large number of substances can be used in the composition of the present invention as polymerization initiators which can be activated by radiation, particularly actinic light. Examples are benzoin and its derivatives, combinations of benzophenone and Michler,s Ketone, combinations of thioxanthone and p-dialkylamino benzoate, trichloromethyl-s-triazines, carbonylmethylene heterocycles containing trihalomethyl groups, for example 2-(p-trichloromethylbenzoylmethylene)-3-ethyl benzothiazoline, acridine derivatives, for example 9-phenylacridine, 9-p-methoxyphenylacridine, 9-acetylaminoacridine and benz(a)acridine. Other examples are phenazine derivatives, for example 9,10-dimethylbenz(a)phenazine and 10-methoxybenz(a)phenazine, quinoxaline derivatives, for example 6,4',4"-trimethoxy-2,3diphenylquinoxaline and 4',4"-dimethoxy-2,3-diphenyl-5-azaqinoxaline, quinazoline derivatives and quinoline derivatives, for example 3-benzylidene-9-phenyl-2,3-dihydro-1H-cyclopenta[b]quinoline. The initiators are generally employed in an amount of about 0.01 to 10, preferably 0.05 to 4, % by weight, based on the non-volatile components of the mixture.

The composition according to the present invention generally contains about 40 to 80, preferably 50 to 75, in particular 60 to 70, % by weight of binder (c) and about 20 to 60, preferably 25 to 50; in particular 30 to 40, % by weight of polymerizable compounds (a), in each case based on the total amount of non-volatile components.

The composition can contain, as further conventional components, polymerization inhibitors, other stabilizers, hydrogen donors, sensitometric regulators, dyes, leuco dyes, photooxidizing agents, for example tribromomethylphenylsulfone, pigments, plasticizers and thermally activatable crosslinking agents.

Suitable actinic radiation to which the composition according to the present invention is sensitive is any electromagnetic radiation whose energy is sufficient to initiate polymerization. Visible and ultraviolet light, x-rays and electron radiation are particularly suitable. Laser radiation in the visible and UV range can also be used. Shortwave-length visible and near-UV light is preferred.

Examples of suitable supports for recording materials produced using the composition according to the invention are aluminum, steel, zinc, copper or screens or plastics films of, for example, polyethylene terephthalate. The surface of the support can be pretreated chemically or mechanically in order to adjust the adhesion of the layer to the appropriate level.

The composition according to the present invention is preferably used as a dry transferable photoresist material. For this purpose, the composition can be applied in a conventional manner, as a preproduced, transferable dry resist film, onto the workpiece to be processed, for example, onto base material for printed circuit boards. In general, the dry resist material is prepared by applying a solution of the composition in a solvent onto a suitable support, such as a polyester film, and drying it. The thickness of the resist layer can be about 10 to 80 μm, and is preferably 20 to 60 μm. The free surface of the layer is preferably covered with a cover film of, for example, polyethylene or polypropylene. The ready-prepared laminate can be stored as a large roll and can be cut, as required, into resist rolls of any width.

The films can be processed using apparatus conventionally employed in dry resist technology. In a commercial laminating apparatus, the cover film is peeled off and the photoresist layer is laminated with a drilled, copper-clad base material. The board prepared in this manner is exposed through an image-bearing transparency and then developed in a conventional manner after the support film has been removed.

Suitable developers are aqueous, preferably aqueous-alkaline, solutions, e.g., solutions of alkali metal phosphates, carbonates or silicates, to which, if required, small amounts (for example, up to 10% by weight) of water-miscible organic solvents or wetting agents can be added. Particularly preferred are aqueous solutions of alkali metal carbonates.

The compositions according to the invention can be employed for a very large range of uses. They are particularly advantageously used in the form of a dry resist film for the production of resists, i.e., protective layers against etching or electroplating resists, on metallic supports such as copper.

The dry resist materials according to the present invention have an optimum layer consistency and are therefore readily processable. Good adhesion of the layers to polyester film prevents lifting of the film, when laminated boards are cut to size. The layers exhibit good adhesion to copper in the unexposed and exposed states. Short development and stripping times permit a high throughput in the production of printed circuit boards. The dry resist layers of the invention have an excellent etch and electroplating resistance and can, moreover, be employed for exacting tenting applications. Dry resist layers based on styrene-containing polymers are particularly preferred as etch resists for etching media containing ammonia.

As against the closest prior art according to DE-A 20 64 080, 23 63 806 and 34 27 653, the compositions of the present invention have the advantage of a particularly speedy developability and exhibit, also in other respects, excellent properties in the application as dry resists. This is attributed to the fact that the copolymers, in spite of their relatively low acid numbers, show a better solubility in alkaline media than corresponding polymers of the prior art.

Compared with the teachings of DE-B 25 17 656 it is surprising that these advantages can be achieved with only one binder.

The composition according to the present invention has, even in the exposed state, a good etch resistance to alkaline, in particular ammoniacontaining, etching media, which are customarily used in the processing of dry resists. This property is improved to an unexpected extent by the presence of a fourth, aromatic monomer (c4)- preferably of styrene or a substituted styrene-in the binder. The speedy developability is practically not impaired by this monomer.

The composition according to the present invention is particularly suitable for use in the dry resist method. It is also suitable for other applications, for example, in preparing photoresist solutions, printing plates, relief images, stencils for screen printing, and color proofing films.

The examples below illustrate preferred embodiments of the composition according to the present invention and the application thereof. If not stated otherwise, percentages and amounts are understood as being in weight units. Parts by weight (pbw) bear the same relation to parts by volume (pbv) as does the gram to the cubic centimeter.

EXAMPLE 1

The following coating solutiosn were prepared:

| | | |
|---|---|---|
| 5.7 | pbw | of one of the polymers indicated below, added as a 31% strength solution (18.4 pbw) in ethanol/butanone (1:1), |
| 2.15 | pbw | of the diurethane obtained from 2 moles of hydroxyethyl methacrylate and 1 mole of 2,2,4-trimethylhexamethylene diisocyanate, |
| 2.15 | pbw | of the reaction product obtained from 1 mole of hydroxyethyl methacrylate, 6 moles of ethylene oxide and 1 mole of butyl isocyanate, |
| 0.035 | pbw | of 9-phenylacridine, |
| 0.083 | pbw | of leuco crystal violet, |
| 0.019 | pbw | of 1',3',3'-trimethyl-6-nitro-8-methoxy-spiro[2H-1-benzopyran-2,2'-indoline] and |
| 0.005 | pbw | of Victoria Pure Blue FGA (C.I. Basic Blue 81) in |
| 3 | pbw | of ethanol and |
| 3 | pbw | of butanone. |

The following polymers were used:

| poly-mer | constituents (% by weight) | | | Tg(K) (calc.) | acid num-ber (calc.) | viscosity (15% in EtOH at 25° C.; mm²/s) | solu-bil-ity** |
|---|---|---|---|---|---|---|---|
| | MAA* | MMA* | EHA* | | | | |
| 1(C) | 10 | 53 | 37 | 307 | 65 | 26.6 | — |
| 2 | 12.5 | 49 | 38.5 | 307 | 82 | 24.6 | + |
| 3 | 15 | 46 | 39 | 307 | 98 | 27.3 | + |
| 4 | 17.5 | 43 | 39.5 | 307 | 114 | 27.8 | + |
| 5 | 20 | 40 | 40 | 307 | 130 | 27.0 | + |
| 6 | 22.5 | 36.5 | 41 | 307 | 147 | | + |
| 7 | 25 | 33 | 42 | 307 | 163 | | + |
| 8(C) | 30 | 26 | 44 | 307 | 196 | | + |
| 9(C) | 35 | 20 | 45 | 307 | 228 | | + |

C = comparative test
*MAA = methacrylic acid
MMA = methyl methacrylate
EHA = ethylhexyl acrylate
**1 g of polymer in 100 ml of a 1% strength sodium carbonate solution
+ = completely soluble
— = incompletely soluble Biaxially stretched and heat-set polyethylene terephthalate films having a thyickness of 25 μm were spin-coated with the solutions to give a layer weight oof 45 g/m², in each case, after drying at 100° c.

A commercial laminating apparatus was used for laminating the dry resist films thus prepard at 115° C. to phenolic laminated boards clad with 35 μm thick copper foil.

The followint resist properties were tested:

1. Develooment Time $t_E$

After peeling off the polyester films the layers were developed in a spray-developing apparatus using a 1% strength sodium carbonate solution. The time required for completely removing the unexposed resist layers corresponds to the development time tE.

2. Stripping Time $t_S$

The coated circuit boards (5×15 cm) were overall exposed for 6 seconds to a 5 kW metal halide lamp in a vacuum frame. After a holding time of 90 minutes the polyester films were peeled off and the uncovered layers treated with a 1% strength sodium carbonate solution in a spray-developing apparatus (1.5 ×$t_E$). For stripping the boards treated with the developer 200 ml of a stripper solution (3% strength KOH) were filled into a 200 ml beaker having a diameter of 6 cm and heated at 50° C. The solution was then stirred with a magnetic stirrer and one of the developed plates was immersed into the solution. The end of the layer removal was put on record.

3. Etch Resistance to Solutions containing Ammonia

The coated circuit boards (35 μm copper cladding) were exposed for 6 seconds under a line transparency with lines and spaces between 100 and 500 μm.

After exposure the polyester films were peeled off and the layers developed in a spray-developing apparatus using a 1% strength sodium carbonate solution. The treatment time corresponded to 1.5 ×$t_E$.

Etching was carried out in a commercial conveyorized etching device using an ammonia/cupric chloride solution at 45° C and pH 8.3 and 1.5 times the etching time required for a 35 μm copper cladding. The extent of the removal of resist structures after the etching procedure was evaluated. The results are compiled in the following table:

| polymer | development time $t_E$ (s) | stripping time $t_S$ (s) | etch resistance pH 8.3 |
|---------|---------------------------|--------------------------|------------------------|
| 1(C)    | above 300                 | 95                       |                        |
| 2       | 80                        | 85                       | +                      |
| 3       | 40                        | 50                       | +                      |
| 4       | 40                        | 52                       | +                      |
| 5       | 33                        | 41                       | 0                      |
| 8(C)    | 46                        | 77                       | −                      |
| 9(C)    | 80                        | 87                       | −                      |

+ no resist structures removed
0 resist structures partly removed
− resist structures completely removed

EXAMPLE 2

Coating solutions were prepared as described in Example 1, with the difference that 5.7 pbw of the following binders were used:

| polymer | MAA | MMA | EHA | Tg(K) (calc.) | acid number (calc.) | viscosity mm²/s | solubility |
|---------|------|------|------|---------------|---------------------|-----------------|------------|
| 10(C)   | 10   | 63.5 | 26.5 | 326           | 65                  | 51.1            | −          |
| 11      | 12.5 | 60   | 27.5 | 326           | 82                  | 46.3            | −          |
| 12      | 15   | 56.5 | 28.5 | 326           | 98                  |                 | +          |
| 13      | 17.5 | 53.5 | 29   | 326           | 114                 | 43.2            | +          |
| 14      | 20   | 50   | 30   | 326           | 130                 |                 | +          |
| 15      | 22.5 | 46.5 | 31   | 326           | 147                 |                 | +          |
| 16      | 25   | 43   | 32   | 326           | 163                 |                 | +          |
| 17(C)   | 30   | 36   | 34   | 326           | 196                 |                 | +          |
| 18(C)   | 35   | 30   | 35   | 326           | 228                 |                 | +          |

Polyester films were spin-coated with these solutions and then dried to produce dry resist materials with 38 μm thick resist layers, which were tested as in Example 1.

The results obtained are shown in the following table:

| polymer | development time $t_E$ (s) | stripping time $t_S$ (s) | etch resistance pH 8.3 |
|---------|---------------------------|--------------------------|------------------------|
| 10(C)   | above 300                 | 75                       |                        |
| 12      | 60                        | 43                       | +                      |
| 13      | 40                        | 38                       | +                      |
| 14      | 40                        | 40                       | 0                      |
| 17(C)   | 50                        | 75                       | −                      |
| 18(C)   | 90                        | 93                       | −                      |

EXAMPLE 3

Polyester films as indicated in Example 1 were spin-coated with solutions of the following compositions such that, after drying, a layer weight of 43 g/m2 was obtained in each case:

| | | |
|---|---|---|
| 6.3 | pbw | of one of the polymers indicated below (= 18.4 pbw of a 31% strength solution in ethanol/butanone, 1:1), |
| 1.85 | pbw | of the diurethane specified in Example 1, |
| 1.11 | pbw | of the monomethacrylate specified in Example 1, |
| 0.74 | pbw | of trimethylolpropane-tris-acryloyloxy-ethylether, |
| 0.035 | pbw | of 9-phenylacridine, |
| 0.081 | pbw | of leuco crystal violet, |
| 0.01 | pbw | of 1',3',3'-trimethyl-6-nitro-8-methoxy-spiro[2H-1-benzopyran-2,2'-indoline], |
| 0.005 | pbw | of Victoria Pure Blue FGA and |
| 0.01 | pbw | of tribromomethylphenylsulfone in |
| 3 | pbw | of ethanol and |
| 3 | pbw | of butanone. |

The polymers used were the binders 1 to 18 indicated in Examples 1 and 2. The resist layers were tested as described in Example 1. The results obtained are shown in the following table:

| polymer | development time $t_E$ (s) | stripping time $t_S$ (s) | etch resistance pH 8.3 |
|---------|---------------------------|--------------------------|------------------------|
| 1(C)    | above 300                 |                          |                        |
| 2       | 70                        | 51                       | +                      |
| 3       | 45                        | 44                       | +                      |
| 4       | 40                        | 49                       | +                      |
| 5       | 40                        | 46                       | +                      |
| 6       | 50                        | 45                       | +                      |
| 7       | 50                        | 47                       | 0                      |
| 8(C)    | 60                        | 75                       | −                      |
| 9(C)    | 70                        | 80                       | −                      |
| 10(C)   | above 300                 | 64                       |                        |
| 11      | above 300                 | 40                       |                        |
| 12      | 80                        | 38                       | +                      |
| 13      | 60                        | 38                       | +                      |
| 14      | 40                        | 38                       | +                      |
| 15      | 45                        | 44                       | +                      |
| 16      | 50                        | 48                       | −                      |
| 17(C)   | 60                        | 65                       | −                      |
| 18(C)   | 70                        | 73                       | −                      |

EXAMPLE 4

The following coating solutions were prepared:

| | | |
|---|---|---|
| 7.1 | pbw | of one of the polymers indicated below (= 22.9 pbw of a 31% strength solution in ethanol/butanone, 1:1), |
| 1.45 | pbw | of the diurethane specified in Example 1, |
| 0.87 | pbw | of the monomethacrylate of Example 1, |
| 0.58 | pbw | of trimethylolpropane-tris-acryloyloxy-ethylether, |
| 0.035 | pbw | of 9-phenylacridine, |
| 0.081 | pbw | of leuco crystal violet, |
| 0.01 | pbw | of 1',3',3'-trimethyl-6-nitro-8-methoxy-spiro[2H-1-benzopyran-2,2'-indoline], |

-continued 0.005 pbw of Victoria Pure Blue FGA and
0.01 pbw of tribromomethylphenylsulfone in
3 pbw of ethanol and
3 pbw of butanone.

The polymers listed below were used:

| polymer | MAA | MMA | BA* | Tg (K) (calc.) | acid number (calc.) |
|---|---|---|---|---|---|
| 19 | 15 | 57 | 28 | 323 | 98 |
| 20 | 17.5 | 53.5 | 29 | 323 | 114 |
| 21 | 20 | 50 | 30 | 323 | 130 |
| 22 | 22.5 | 46.5 | 31 | 323 | 147 |
| 23 | 25 | 43 | 32 | 323 | 163 |
| 24(C) | 30 | 36 | 34 | 323 | 196 |

BA* = butyl acrylate

The resist layers (layer thickness 38 μm) obtained by application of the solutions according to the spin-coating process and subsequent drying were examined with respect to development and stripping times and etch resistance to solutions containing ammonia, as described in Example 1. In addition, the capability of covering drilled holes (tenting0 was tested. For this purpose, the photoresist layers were laminated to copper-clad test plates provided with holes having diameters in the range between 6 and 10 mm and the resist layers were exposed through a negative transparency corresponding to the holes (diameter of the transparent points 6.4 to 10.4 mm). The non-exposed layer areas were then washed off with a 1% strength sodium carbonate solution and the uncovered copper etched away with an ammonia/cupric chloride solution. The maximum hole diameter which was entirely covered with hardened photoresist after etching was recorded. All results are compiled in the following table.

| polymer | development time $t_E$ (s) | stripping time $t_S$ (s) | etch resistance pH 8.3 | tenting (mm) |
|---|---|---|---|---|
| 19 | 200 | 73 | + | |
| 20 | 70 | 67 | + | 10 |
| 21 | 50 | 38 | + | 10 |
| 22 | 50 | 35 | 0 | 10 |
| 23 | 50 | 34 | − | 9 |
| 24(C) | 60 | 42 | − | −* |

*swollen resist surface, unsuitable for tenting applications

EXAMPLE 5

Resist solutions based on the formula given in Example 3 were prepared, using the following polymers:

| polymer | MAA | MMA | styrene | EHA | BA | Tg (K) (calc.) | acid number (calc.) |
|---|---|---|---|---|---|---|---|
| 25 | 20 | 40 | — | 25 | 15 | 306 | 130 |
| 26 | 20 | 45 | — | 20 | 15 | 315 | 130 |
| 27 | 20 | 50 | — | 15 | 15 | 325 | 130 |
| 28 | 20 | 35 | 5 | 25 | 15 | 306 | 130 |
| 29 | 20 | 40 | 5 | 20 | 15 | 315 | 130 |
| 30 | 20 | 45 | 5 | 15 | 15 | 325 | 130 |
| 31 | 25 | 28 | 5 | 27 | 15 | 306 | 163 |
| 32 | 25 | 33 | 5 | 22 | 15 | 315 | 163 |
| 33 | 25 | 38 | 5 | 17 | 15 | 325 | 163 |
| 34 | 25 | 28 | 10 | 22 | 15 | 315 | 163 |
| 35 | 25 | 18 | 20 | 22 | 15 | 315 | 163 |
| 36 | 25 | 8 | 30 | 22 | 15 | 315 | 163 |

The coating solutions were spin-coated onto polyethylene terephthalate films, as described in Example 1, in such a way that, after drying, a layer weight of 43 g/m² was obtained in each case. The resist films were tested as described in Example 1. The test results are compiled in the following table:

| polymer | development time $t_E$ (s) | stripping time $T_S$ (s) | etch resistance pH 8.3 | etch resistance pH 8.5 |
|---|---|---|---|---|
| 25 | 40 | 47 | + | − |
| 26 | 40 | 35 | + | − |
| 27 | 40 | 38 | + | − |
| 28 | 40 | 50 | + | + |
| 29 | 40 | 44 | + | + |
| 30 | 40 | 44 | + | + |
| 31 | 50 | 59 | 0 | − |
| 32 | 50 | 58 | − | − |
| 33 | 50 | 45 | − | − |
| 34 | 50 | 30 | + | |
| 35 | 50 | 36 | + | |
| 36 | 50 | 43 | + | |

EXAMPLE 6

Resist layers were prepared analogously to Example 3, using the following binders:

| polymer | MAA | MMA | *EA | *ODA | Tg (K) (calc.) | acid number (calc.) |
|---|---|---|---|---|---|---|
| 37 | 20 | 25 | 55 | — | 306 | 130 |
| 38 | 20 | 32 | 48 | — | 315 | 130 |
| 39 | 20 | 40 | 40 | — | 326 | 130 |
| 40 | 20 | 40 | — | 40 | 306 | 130 |
| 41 | 20 | 45 | — | 35 | 315 | 130 |
| 42 | 20 | 50 | — | 30 | 325 | 130 |

*EA = ethyl acrylate
*ODA = mixture of 40% of octylacrylate and 60% of decylacrylate The development and stripping times of the resist layers and the evaluation of the etch resistance to solutions containing ammonia are shown in the following table:

| polymer | development time $t_E$ (s) | stripping time $t_S$ (s) | etch resistance pH 8.3 |
|---|---|---|---|
| 37 | 40 | 48 | + |
| 38 | 40 | 47 | + |
| 39 | 40 | 35 | + |
| 40 | 40 | 48 | + |
| 41 | 40 | 46 | + |
| 42 | 40 | 40 | + |

EXAMPLE 7

The dry resist films described in Examples 1 to 6 were laminated at 115° C., using a commercial laminating apparatus, to phenolic laminated boards clad with 35 μm thick copper foil, and exposed for 6 seconds to a 5 kW metal halide lamp in a vacuum frame. The original used was a line transparency with line widths and spacings down to 80 μm.

After exposure, the polyester film was, in each case, peeled off and the layer developed for 1.5 times the development time (1.5 tE) with a 1% strength sodium carbonate solution in a spray-developing apparatus.

The boards were then rinsed for 30 seconds with tap water, etched for 30 seconds in a 15% strength ammonium peroxydisulfate solution, rinsed again with water, immersed for 30 seconds into 10% strength sulfuric acid, and then successively plated in the following electrolytic baths:

| | | | | Tg (K) | acid number (calc.) | development time | |
|---|---|---|---|---|---|---|---|
| polymer | MAA | MMA | HMA* | (calc.) | | | tenting |
| 43 | 20 | 29 | 51 | 326 | 130 | above 360 | not usable |
| 44 | 25 | 21 | 54 | 326 | 163 | 150 | |

HMA* = hexyl methacrylate

The two resist layers cannot be used for tenting applications. Already when peeling off the polyester film, the exposed self-supporting layer areas split open.

What is claimed is:

1. A radiation-polymerizable composition comprising
   a) from about 20 to 60% by weight of a constituent which can undergo free-radical polymerization contains at least one terminal ethylenically unsaturated group and has a boiling point above 100° C. under normal pressure, wherein said constituent contains at least 40%, based on the total amount of said constituent, of compounds having at least one urethane group in the molecule,
   b) from about 0.01 to 10% by weight of a compound which is capable of initiating the polymerization of constituent (a), under the action of actinic radiation, and
   c) from about 40 to 80% by weight of a saturated copolymer which is insoluble in water and soluble in organic solvents and in aqueous-alkaline solutions, and which comprises
      c1) from 12 to 27% by weight of units of acrylic acid or methacrylic acid,
      c2) from about 20 to 50% by weight of methyl methacrylate, and
      c3) from about 15 to 50% by weight of an alkyl acrylate, having from 4 to 8 carbon atoms in the alkyl gruop, and
      c4) from about 1 to 20% by weight of a substituted or unsubstituted styrene,
   and has an acid number of about 78 to 176 and a glass transition temperature of about 290 to 340K. wherein the product obtained by multiplying the difference of the glass transition temperatures of the units c2 and c3 in Kelvin by the amount of unit c3 in per cent is at least 4000.

2. A composition as claimed in claim 1, wherein said units (c1) comprise methacrylic acid or a mixture of acrylic and methacrylic acids containing up to about 50% of acrylic acid.

3. A composition as claimed in cliam 1, wherein said alkyl acrylate is butyl acrylate or ethyl hexyl acrylate.

4. A composition as claimed in claim 1, wherein said copolymer comprises about 12 to 27% by weight of units (c1), about 20 to 50% by weight of units (c2), about 20 to 50% by weight of units (c3), and about 1 to 20% by weight of units (c4).

5. A composition as claimed in claim 4, wherein said copolymer comprises 17 to 25% by weight of units (c1), 20 to 50% by weight of units (c2), 20 to 45% by weight of units (c3), and 1 to 20% by weight of units (c4).

6. A composition as claimed in claim 1, wherein said constituent (a) comprises an ester of acrylic or methacrylic acid.

7. A composition as claimed in claim 6, wherein said constituent (a) comprises a compound containing at least two terminal ethylenically unsaturated groups.

8. A composition as claimed in claim 1, wherein said copolymer is soluble in a 1% strength sodium carbonate solution.

9. A radiation-sensitive recording material comprising a support and a radiation-sensitive layer which comprises a composition as claimed in claim 1.

10. A recording material as claimed in claim 9, wherein said support has a surface comprising aluminum, steel, zinc or copper.

11. A recording material as claimed in cliam 9, wherein said support has a surface comprising a plastic film.

12. A radiation-polymerizable composition as claimed in claim 1, wherein said copolymer has a glass transition temperature of 290 to 330K.

13. A radiation-polymerizable composition as claimed in claim 12, wherein said copolymer has a glass transition temperature of 305 to 330K.

14. A radiation-polymerizable composition as claimed in claim 1, wherien said copolymer has an acid number of 98 to 176.

15. A radiation-polymerizable composition as claimed in claim 14, wherein said copolymer has an acid number of 111 to 163.

16. A radiation-polymerizable composition as claimed in claim 1, consisting essentially of the recited ingredients.

* * * * *